(12) United States Patent
Zhao (10) Patent No.: US 11,754,626 B1
(45) Date of Patent: *Sep. 12, 2023

(54) DDR5 SDRAM DIMM SLOT DETECTION SYSTEM AND METHOD THEREOF

(71) Applicants: Inventec (Pudong) Technology Corporation, Shanghai (CN); Inventec Corporation, Taipei (TW)

(72) Inventor: Jin-Dong Zhao, Shanghai (CN)

(73) Assignees: Inventec (Pudong) Technology Corporation, Shanghai (CN); Inventec Corporation, Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/701,429

(22) Filed: Mar. 22, 2022

(30) Foreign Application Priority Data

Mar. 18, 2022  (CN) .......................... 202210269721.7

(51) Int. Cl.
*G01R 31/319* (2006.01)
*G01R 31/3185* (2006.01)

(52) U.S. Cl.
CPC .............. *G01R 31/31905* (2013.01); *G01R 31/318572* (2013.01); *G01R 31/318597* (2013.01)

(58) Field of Classification Search
CPC ...... G01R 31/31905; G01R 31/318572; G01R 31/318597
See application file for complete search history.

(56) References Cited

U.S. PATENT DOCUMENTS

2022/0050803 A1* 2/2022 Xie ..................... G06F 13/4068
2022/0365676 A1* 11/2022 Nguyen ............... G06F 13/4221

OTHER PUBLICATIONS

H. B. Shashidhara, S. Yellampalii and V. Goudanavar, "Board level JTAG/boundary scan test solution," International Conference on Circuits, Communication, Control and Computing, Bangalore, India, 2014, pp. 73-76. (Year: 2014).*

* cited by examiner

*Primary Examiner* — Cynthia Britt
(74) *Attorney, Agent, or Firm* — David R. Stevens; Stevens Law Group (57) ABSTRACT

A DDR5 SDRAM DIMM slot detection system and a method thereof are disclosed. A first detection board is serially connected to a second detection board, a JTAG controller converts a DIMM detection instruction, which is generated by a detection device, into a DIMM detection instruction in JTAG format; the DIMM detection instruction in JTAG format is provided to the first detection board or second detection board through the adapter circuit board, so as to detect DDR5 SDRAM DIMM slots of the circuit board under test, thereby achieving the technical effect of improving efficiency in detection for DDR5 SDRAM DIMM connection interface.

10 Claims, 7 Drawing Sheets

DDR5 SDRAM DIMM SLOT DETECTION SYSTEM AND METHOD THEREOF

BACKGROUND OF THE INVENTION

1. Field of the Invention

The present invention is related to a detection system and a method thereof, and more particularly to a DDR5 SDRAM DIMM connection interface detection system and a method thereof.

2. Description of the Related Art

In recent years, the circuit boards designed for double data rate fifth-generation synchronous dynamic random-access memory (DDR5 SDRAM) are in the preliminary trial production stage, and the test solution for a DDR5 SDRAM dual in-line memory module (DIMM) connection interface can only be performed based on the existing physical memories. However, the test solution that relies on physical memory has problems of long test cycle, low coverage for physical pin connection verification, and deviation in error reporting directionality.

According to above-mentioned contents, what is needed is to develop an improved solution to solve the conventional technology problems of long test cycle, low coverage for physical pin connection verification, and deviation in error reporting directionality in the convention DDR5 SDRAM DIMM connection interface detection.

SUMMARY OF THE INVENTION

An objective of the present invention is to disclose a DDR5 SDRAM DIMM slot detection system and a method thereof, to solve the conventional technology problems of long test cycle, low coverage for physical pin connection verification, and deviation in error reporting directionality in the convention DDR5 SDRAM DIMM connection interface detection.

In order to achieve the objective, the present invention provides a DDR5 SDRAM DIMM slot detection system including a circuit board under test, a first detection board, a second detection board, an adapter circuit board, a joint test action group (JTAG) controller, and a detection device.

The circuit board under test includes at least two dual in-line memory module (DIMM) slots adapted to double data rate fifth-generation synchronous dynamic random-access memory (DDR5 SDRAM).

The first detection board includes a first DIMM connection interface, a first universal serial bus type-C (USB-C) connection interface and a second USB-C connection interface, wherein the first detection board is inserted into one of the at least two DDR5 SDRAM DIMM slots of the circuit board under test through the first DIMM connection interface.

The second detection board includes a second DIMM connection interface, a third USB-C connection interface, and a fourth USB-C connection interface, wherein the second detection board is inserted into another of the at least two DDR5 SDRAM DIMM slots of the circuit board under test through the second DIMM connection interface, wherein the third USB-C connection interface is electrically connected to the second USB-C connection interface.

The adapter circuit board includes a USB-C connection interface and a joint test action group (JTAG) connection interface, wherein the JTAG connection interface support includes but not limited to "IEEE 1149.1" and "IEEE 1149.6" which refer to an approved IEEE standard project, wherein the USB-C connection interface is electrically connected to the first USB-C connection interface, and the adapter circuit board provides data conversion between the USB-C connection interface and the JTAG connection interface.

The JTAG controller includes at least one JTAG insertion interface and an external-device connection interface, wherein the controller and the at least one insertion interface support include but not limited to "IEEE 1149.1" and "IEEE 1149.6" which refer to the approved IEEE standard project, wherein the at least one JTAG insertion interface is provided to insert with and electrically connected to the JTAG connection interface.

The detection device includes a connection interface configured to electrically connect to the external-device connection interface.

The first detection board is serially connected to the second detection board, the detection device generates a DIMM detection instruction, the JTAG controller converts the generated DIMM detection instruction into a DIMM detection instruction in JTAG format and then provides the DIMM detection instruction in JTAG format to the first detection board and the second detection board through the adapter circuit board, to detect the at least two DDR5 SDRAM DIMM slots of the circuit board under test based on the DIMM detection instruction in JTAG format.

In order to achieve the objective, the present invention provides a DDR5 SDRAM DIMM slot detection method including steps of: providing a circuit board under test which comprises at least two DIMM slots adapted to DDR5 SDRAM; providing a first detection board comprising a first DIMM connection interface, a first USB-C connection interface, and a second USB-C connection interface; inserting the first detection board into one of the at least two DDR5 SDRAM DIMM slots of the circuit board under test through the first DIMM connection interface; providing a second detection board comprising a second DIMM connection interface, a third USB-C connection interface and a fourth USB-C connection interface; inserting the second detection board into another of the at least two DDR5 SDRAM DIMM slots of the circuit board under test through the second DIMM connection interface, wherein the third USB-C connection interface is electrically connected to the second USB-C connection interface; providing an adapter circuit board comprising a USB-C connection interface and a JTAG connection interface; electrically connecting the USB-C connection interface to the first USB-C connection interface, wherein the adapter circuit board provides data conversion between the USB-C connection interface and the JTAG connection interface;

providing a JTAG controller comprising at least one JTAG insertion interface and an external-device connection interface; using the at least one JTAG insertion interface to insert with and electrically connect to the JTAG connection interface; providing a detection device comprising a connection interface, wherein the connection interface is configured to electrically connect to the external-device connection interface; and serially connecting the first detection board to the second detection board, wherein the detection device generates a DIMM detection instruction, the JTAG controller converts the generated DIMM detection instruction into a DIMM detection instruction in JTAG format, and provides the DIMM detection instruction in JTAG format to the first detection board and the second detection board through the adapter circuit board, to detect the at least two DDR5 SDRAM DIMM slots of the circuit board under test based on the DIMM detection instruction in JTAG format.

According to the above-mentioned system and method of the present invention, the difference between the present invention and the conventional technology is that the first detection board is serially connected to the second detection board, the JTAG controller converts the DIMM detection instruction, which is generated by the detection device, into the DIMM detection instruction in JTAG format; the DIMM detection instruction in JTAG format is provided to the first detection board or second detection board through the adapter circuit board, so as to detect DDR5 SDRAM DIMM slots of the circuit board under test.

Therefore, the present invention is able to achieve the technical effect of improving efficiency in detection for DDR5 SDRAM DIMM connection interface.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The DDR5 SDRAM DIMM slot detection system of the present invention is illustrated in the following paragraphs. Please refer to FIG. 1, which is a system block diagram of a DDR5 SDRAM DIMM slot detection system, according to the present invention.

Figure 1:
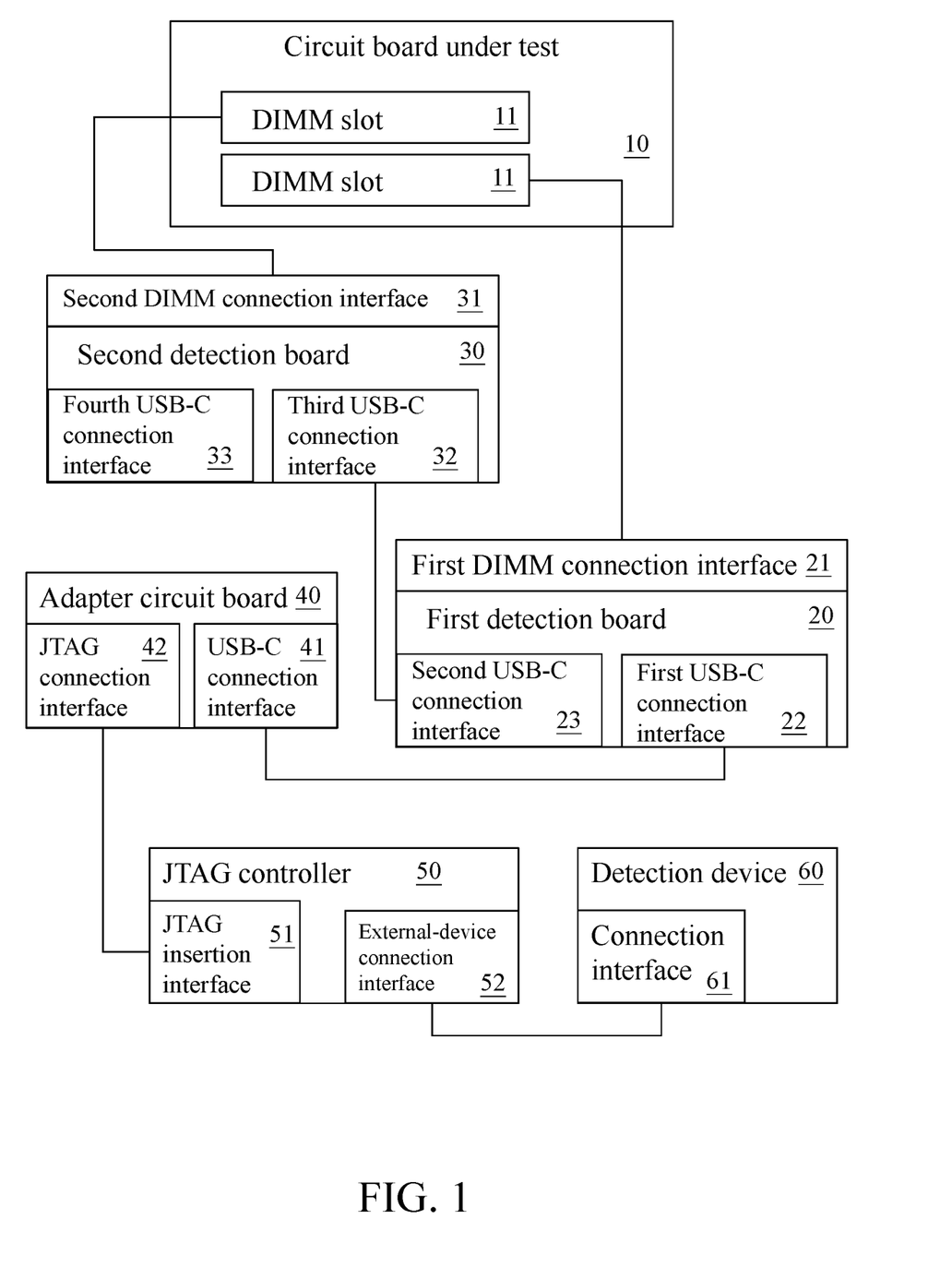
FIG. 1 is a system block diagram of a DDR5 SDRAM DIMM slot detection system, according to the present invention.

The DDR5 SDRAM DIMM slot detection system of the present invention includes a circuit board under test 10, a first detection board 20, a second detection board 30, an adapter circuit board 40, a JTAG controller 50, and a detection device 60.

The circuit board under test 10 includes at least two DIMM slots 11 adapted to DDR5 SDRAM.

Figure 2:
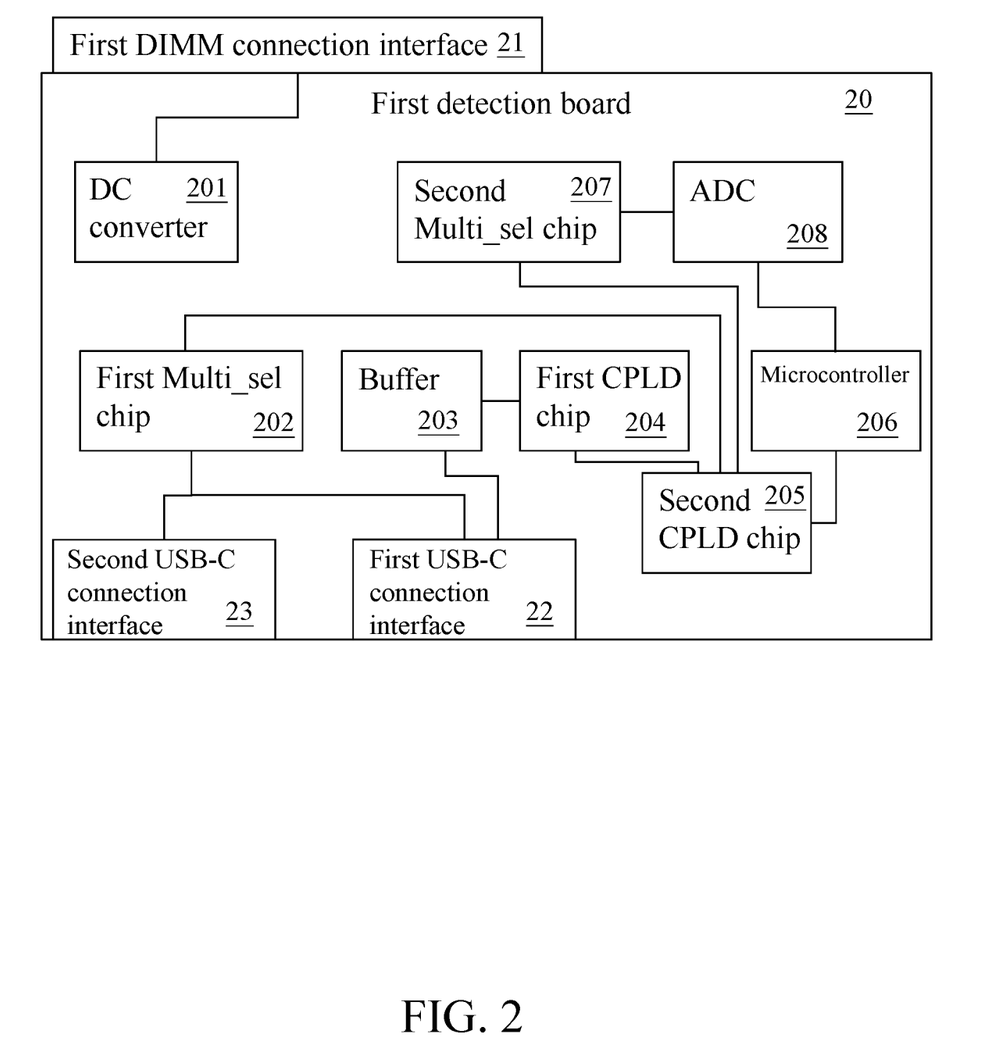
FIG. 2 is a block diagram of components of a first detection board, according to the present invention.

Please refer to FIG. 2, which is a block diagram of components of a first detection board, according to the present invention.

The first detection board 20 includes a first DIMM connection interface 21, a first USB-C connection interface 22, and a second USB-C connection interface 23. The first detection board 20 is inserted into one of at least two DDR5 SDRAM DIMM slots 11 of the circuit board under test 10 through the first DIMM connection interface 21.

It should be noted that the circuit board under test 10 supplies power of 12 volts to the DDR5 SDRAM DIMM slot 11, an operation voltage of an input/output (IO) pin of the DDR5 SDRAM DIMM slot 11 is set as 1.1 volts, so the power supply of the first detection board 20 is designed as 12 volts according to the specification of the DDR5 SDRAM DIMM slot 11, and an operation voltage of an IO pin of the first DIMM connection interface 21 of the first detection board 20 is 1.1 volts.

Besides the first DIMM connection interface 21, the first USB-C connection interface 22 and the second USB-C connection interface 23, the first detection board 20 can include a direct current (DC) converter 201, a first multiple-selection (Multi_sel) chip 202, a buffer 203, a first complex programmable logic device (CPLD) chip 204, a second CPLD chip 205, a microcontroller 206, a second Multi_sel chip 207 and an analog-to-digital converter (ADC) 208.

The first DIMM connection interface 21 is electrically connected to the DC converter 201, the first CPLD chip 204, the second Multi_sel chip 207 and the ADC 208; the second USB-C connection interface 23 is electrically connected to the first Multi_sel chip 202; the first USB-C connection interface 22 is electrically connected to the first Multi_sel chip 202 and the buffer 203; the buffer 203 is electrically connected to the second USB-C connection interface 23 and the first CPLD chip 204; the first CPLD chip 204 is electrically connected to the buffer 203 and the second CPLD chip 205; the second CPLD chip 205 is electrically connected to the first Multi_sel chip 202, the second Multi_sel chip 207, the first CPLD chip 204 and the microcontroller 206; the microcontroller 206 is electrically connected to the second CPLD chip 205 and the ADC 208; the second Multi_sel chip 207 is electrically connected to the first DIMM connection interface 21, the second CPLD chip 205 and the ADC 208; the ADC 208 is electrically connected to the first DIMM connection interface 21, the microcontroller 206 and the second Multi_sel chip 207.

With the above-mentioned configuration, the first detection board 20 can be compliant with the requirement that the power supply of the first detection board 20 is 12 volts and the operation voltage of the IO pin of the first DIMM connection interface 21 of the first detection board 20 is 1.1 volts.

Figure 3:
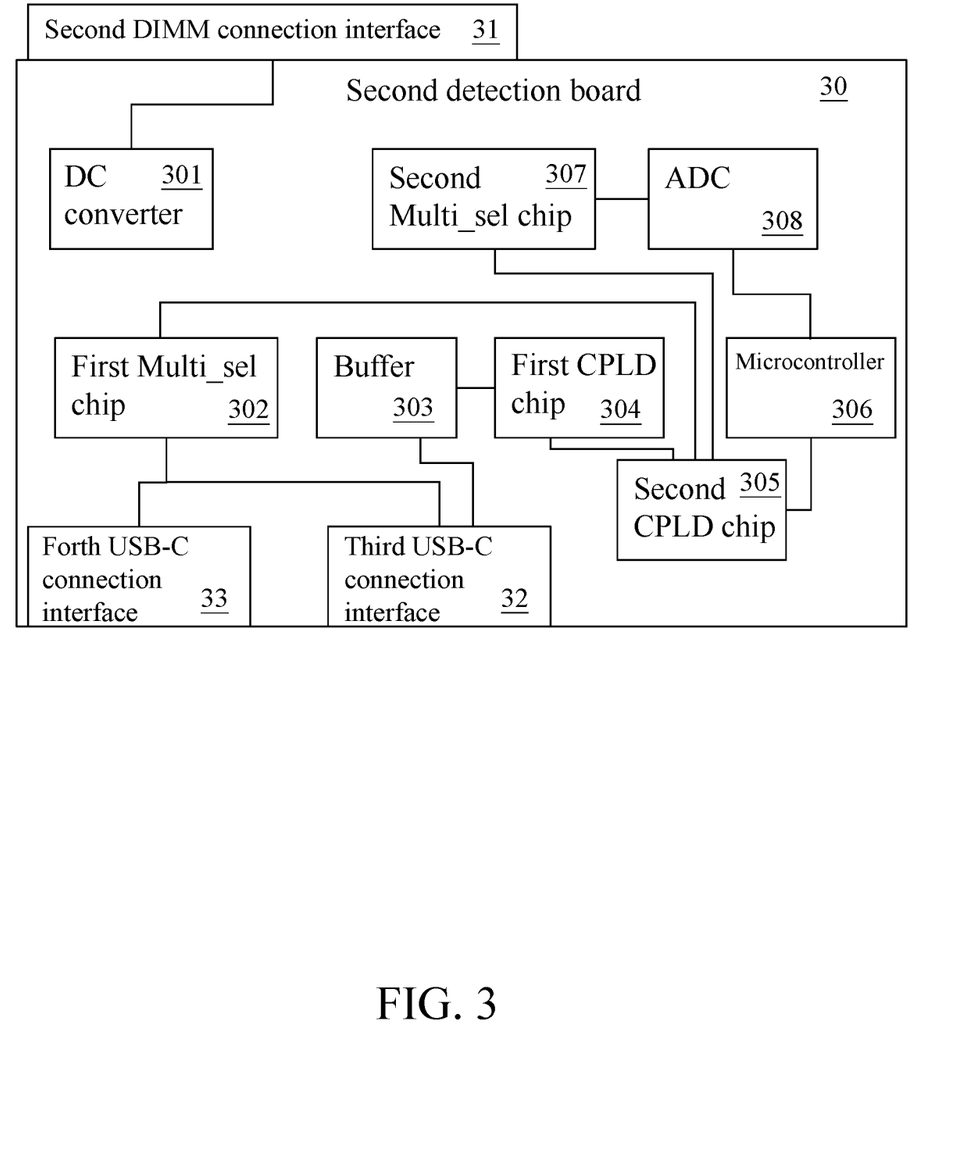
FIG. 3 is a block diagram of components of a second detection board, according to the present invention.

Please refer to FIG. 3, which is a block diagram of components of a second detection board, according to the present invention.

The second detection board 30 includes a second DIMM connection interface 31, a third USB-C connection interface 32, and a fourth USB-C connection interface 33, the second detection board 30 is inserted into one of at least two DDR5 SDRAM DIMM slots 11 of the circuit board under test 10 through the second DIMM connection interface 31.

It should be noted that the circuit board under test 10 supplies power of 12 volts to the DDR5 SDRAM DIMM slot 11, the operation voltage of the IO pin of the DDR5 SDRAM DIMM slot 11 is set as 1.1 volts, so the power supply of the second detection board 30 is also designed as 12 volts according to the specification of the DDR5 SDRAM DIMM slot 11, and the operation voltage of the IO pin of the second DIMM connection interface 31 of the second detection board 30 is 1.1 volts.

Besides the second DIMM connection interface 31, the third USB-C connection interface 32 and the fourth USB-C connection interface 33, the second detection board 30 can include a DC converter 301, a first Multi_sel chip 302, a buffer 303, a first CPLD chip 304, a second CPLD chip 305, a microcontroller 306, a second Multi_sel chip 307 and an ADC 308.

The second DIMM connection interface 31 is electrically connected to the DC converter 301, the first CPLD chip 304, the second Multi_sel chip 307 and the ADC 308; the fourth USB-C connection interface 33 is electrically connected to the first Multi_sel chip 302; the third USB-C connection interface 32 is electrically connected to the first Multi_sel chip 302 and the buffer 303; the buffer 303 is electrically connected to the third USB-C connection interface 32 and the first CPLD chip 304; the first CPLD chip 304 is electrically connected to the buffer 303 and the second CPLD chip 305; the second CPLD chip 305 is electrically connected to the first Multi_sel chip 302, the second Multi_sel chip 307, the first CPLD chip 304 and the microcontroller 306; the microcontroller 306 is electrically connected to the second CPLD chip 305 and the ADC 308; the second Multi_sel chip 307 is electrically connected to the second DIMM connection interface 31, the second CPLD chip 305 and the ADC 308; the ADC 308 is electrically connected to the second DIMM connection interface 31, the microcontroller 306 and the second Multi_sel chip 307.

With the above-mentioned configuration, the second detection board 30 can be compliant with the requirement that the power supply of the second detection board 30 is 12 volts and the operation voltage of IO pin of the second DIMM connection interface 31 of the second detection board 30 is 1.1 volts.

The adapter circuit board 40 includes a USB-C connection interface 41 and a JTAG connection interface 42, wherein the JTAG connection interface 42 support includes but not limited to "IEEE 1149.1" and "IEEE 1149.6" which refer to the approved IEEE standard project. The USB-C connection interface 41 is electrically connected to the first USB-C connection interface 22, and the adapter circuit board 40 provides data conversion between the USB-C connection interface 41 and the JTAG connection interface 42.

It should be noted that the first detection board 20 and the second detection board 30 of the present invention can include more detection boards serially connected to each other; that is, in a condition that multiple the second detection boards 30 are provided, the second USB-C connection interface 23 of the first detection board 20 can be electrically connected to the third USB-C connection interface 32 of a first second detection board 30, the fourth USB-C connection interface 33 of the first second detection board 30 is electrically connected to the third USB-C connection interface 32 of a second second detection board 30, the fourth USB-C connection interface 33 of the second second detection board 30 is electrically connected to the third USB-C connection interface 32 of a third second detection board 30, and so on. Therefore, the first detection board 20 and the second detection boards 30 can form the series concatenation of multiple detection boards.

In practical detection application, single first detection board 20 or single second detection board 30 can be inserted into one of at least two DDR5 SDRAM DIMM slots 11 of the circuit board under test 10; that is, one of the first USB-C connection interface 22 of the first detection board 20 and the third USB-C connection interface 32 of the second detection board 30 is electrically connected to the USB-C connection interface 41.

For convenience in explanation, the first detection board 20 and the second detection board 30 are taken as an example for detection boards in illustration, but the first detection board 20 and the second detection board 30 can be the same type of detection boards.

Figure 4:
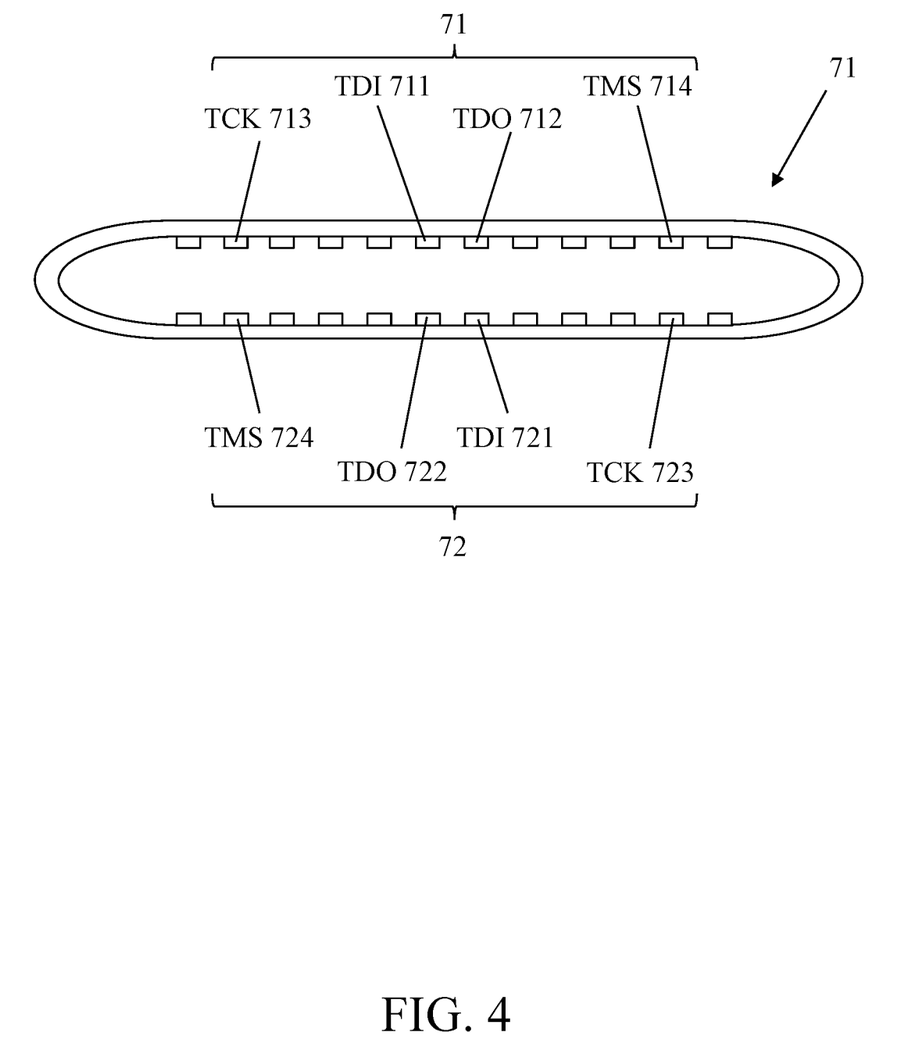
FIG. 4 is a schematic view of pins of a universal serial bus type-C (USB-C) connection interface, according to the present invention.

Please refer to FIG. 4, which is a schematic view of pins of a USB-C connection interface, according to the present invention.

The pin configuration of each of the first USB-C connection interface 22, the second USB-C connection interface 23, the third USB-C connection interface 32, the fourth USB-C connection interface 33 and the USB-C connection interface 41 are described in the following paragraphs.

The USB-C connection interface comprises an upper pin set 71 and a lower pin set 72, the upper pin set 71 includes an upper TDI pin 711, an upper TDO pin 712, an upper test clock (TCK) pin 713, an upper test mode select (TMS) pin 714, and a plurality of upper ground (GND) pins; the lower pin set 72 includes a lower TDI pin 721, a lower TDO pin 722, a lower TCK pin 723, a lower TMS pin 724, and a plurality of lower GND pins 725.

The upper pin set 71 includes twelve pins; based on the pin arrangement of the upper pin set 71 in an order from right to left, the upper TDI pin 711, the upper TDO pin 712, the upper TCK pin 713, the upper TMS pin 714 are the sixth pin, the seventh pin, the second pin and the eleventh pin of the upper pin set 71, and the remaining pins of the upper pin set 71 are the upper GND pins 715.

The lower pin set 72 includes twelve pins; based on the pin arrangement of the lower pin set 72 in an order from left to right, the lower TDI pin 721, the lower TDO pin 722, the lower TCK pin 723, the lower TMS pin 724 are the sixth pin, the seventh pin, the second pin, the eleventh pin of the lower pin set 72, and the remaining pins of the lower pin set 72 are the lower GND pins 725.

Figure 5:
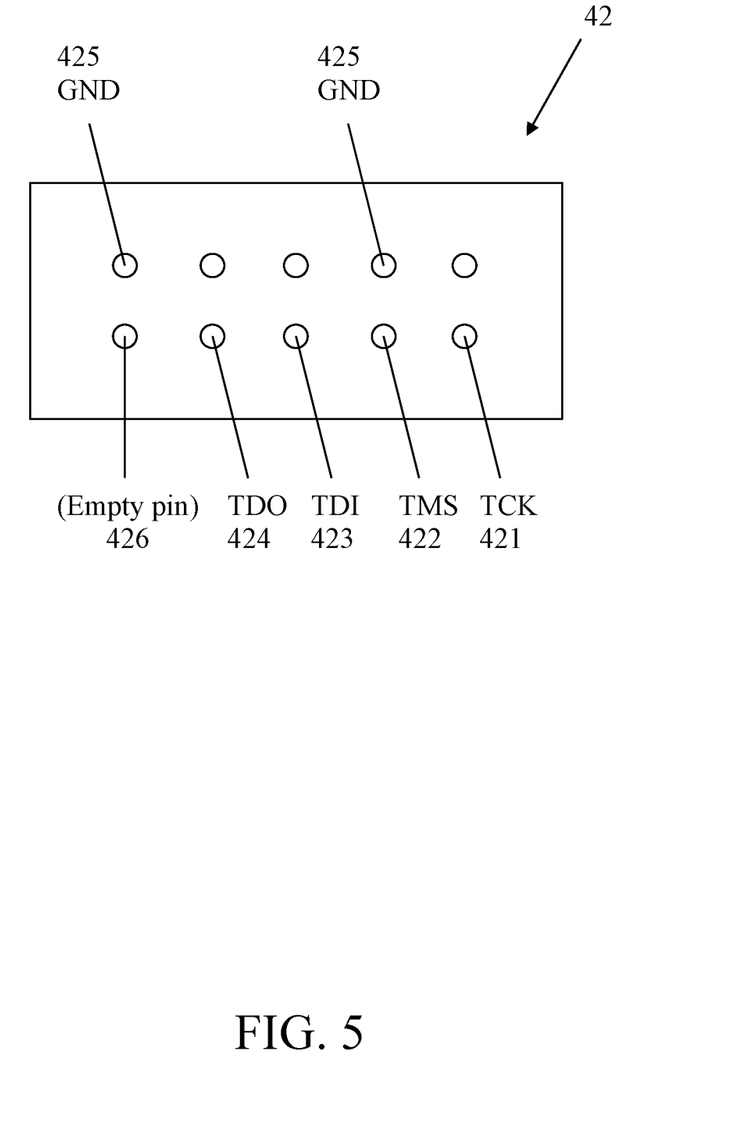
FIG. 5 is a schematic view of pins of a JTAG connection interface, according to the present invention.

Please refer to FIG. 5, which is a schematic view of pins of a JTAG connection interface, according to the present invention.

The pins of the JTAG connection interface 42 are arranged in an upper row and a lower row, respectively, and each of the upper row and the lower row includes five pins, and a TCK pin 421, a TMS pin 422, a TDI pin 423, a TDO pin 424 and a GND pin 425 of the five pins are arranged at fixed positions.

It should be noted that, all of the five pins at the upper row of the JTAG slot 12 are ground pins 425, and the five pins at the lower row of the JTAG slot 12 are, in an order from right to left, a TCK pin 421, a TMS pin 422, a TDI pin 423, a TDO pin 424, an empty pin 426.

Please refer to FIG. 1. The JTAG controller 50 includes at least one JTAG insertion interface 51 and an external-device connection interface 52, wherein the JTAG controller 50 and the at least one JTAG insertion interface 51 support include but not limited to "IEEE 1149.1" and "IEEE 1149.6" which refer to the approved IEEE standard project, the at least one JTAG insertion interface 51 is provided to insert with and electrically connect to the JTAG connection interface 42; the external-device connection interface 52 can be, for example, USB-A, USB-C, RS232 or RJ45, but these examples are merely for exemplary illustration, and the application field of the present invention is not limited to these examples.

The detection device 60 can be, for example, a general computer, a notebook computer or a smart device, but these examples are merely for exemplary illustration, and the application field of the present invention is not limited to these examples. The detection device 60 includes a connection interface 61 configured to electrically connect to the external-device connection interface 52, the connection interface 61 corresponds to the external-device connection interface 52. In an embodiment, the connection interface 61 can be, for example, USB-A, USB-C, RS232 or RJ45, but these examples are merely for exemplary illustration, and the application field of the present invention is not limited to these examples.

The first detection board 20 is serially connected to the second detection board 30, the amount of the second detection board 30 can be single or multiple, the detection device 60 generates a DIMM detection instruction, the JTAG controller 50 converts the generated DIMM detection instruction into a DIMM detection instruction in JTAG format and then provides the DIMM detection instruction in JTAG format to the first detection board 20 and the second detection board 30 through the adapter circuit board 40, to detect the DDR5 SDRAM DIMM slots of the circuit board under test, based on the DIMM detection instruction in JTAG format, to reduce test cycle, improve coverage for physical pin connection verification, and reduce deviation in error reporting directionality.

The operation of the method of the present invention will be described in the following paragraphs. please refer to FIGS. 6A and 6B, which are flowcharts of a DDR5 SDRAM DIMM slot detection method, according to the present invention.

Figure 6A:
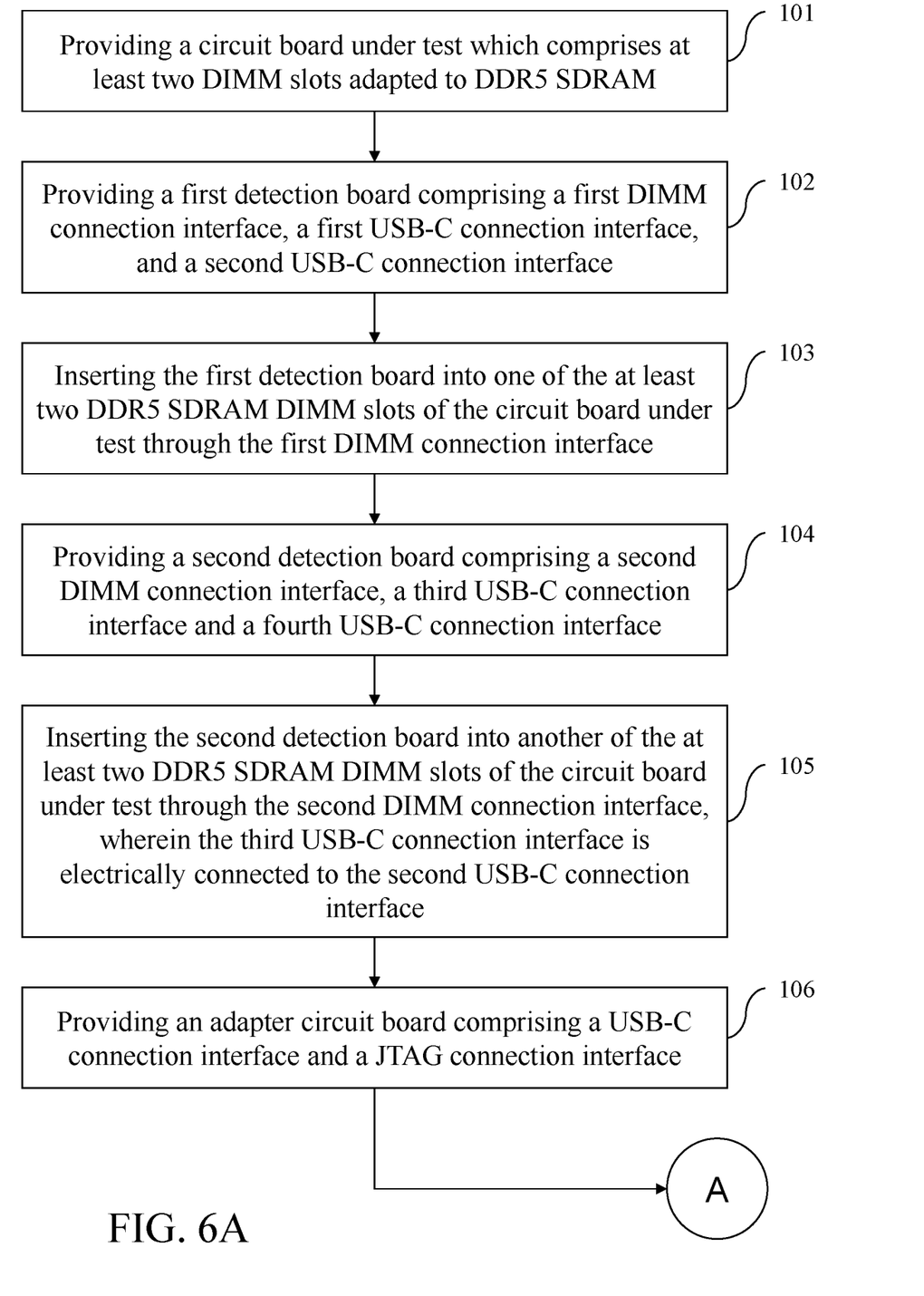
FIGS. 6A and 6B are flowcharts of a DDR5 SDRAM DIMM slot detection method, according to the present invention.
Figure 6B:
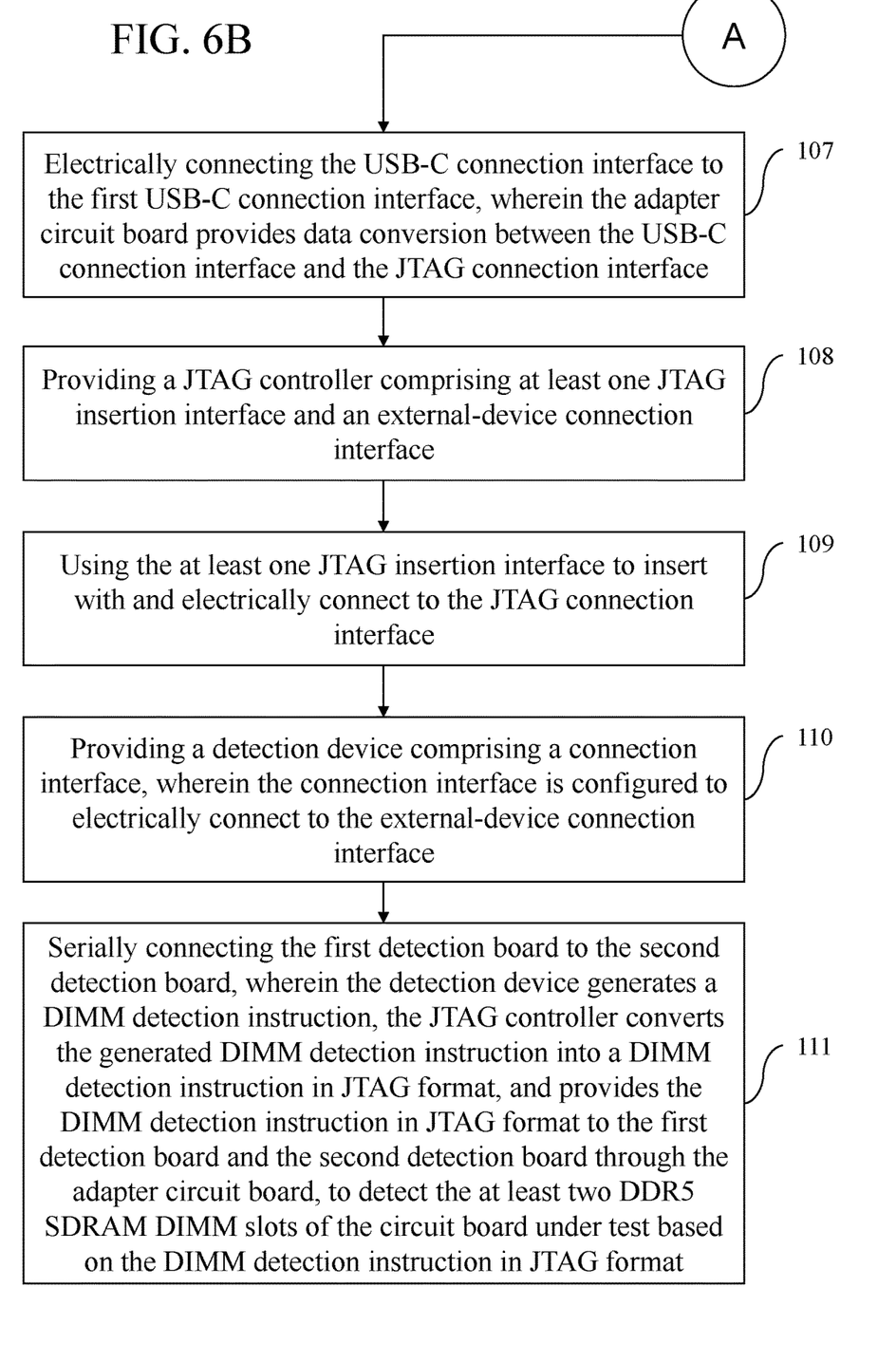

As shown in FIGS. 6A and 6B, the DDR5 SDRAM DIMM slot detection method of the present invention includes the following steps.

First, in a step 101, a circuit board under test including at least two DIMM slots adapted to DDR5 SDRAM, is provided. In a step 102, a first detection board including a first DIMM connection interface, a first USB-C connection interface, and a second USB-C connection interface is provided. In a step 103, the first detection board is inserted into one of the at least two DDR5 SDRAM DIMM slots of the circuit board under test through the first DIMM connection interface. In a step 104, a second detection board including a second DIMM connection interface, a third USB-C connection interface and a fourth USB-C connection interface is provided. In a step 105, the second detection board is inserted into another of the at least two DDR5 SDRAM DIMM slots of the circuit board under test through the second DIMM connection interface, wherein the third USB-C connection interface is electrically connected to the second USB-C connection interface. In a step 106, an adapter circuit board including a USB-C connection interface and a JTAG connection interface is provided. In a step 107, the USB-C connection interface is electrically connected to the first USB-C connection interface, wherein the adapter circuit board provides data conversion between the USB-C connection interface and the JTAG connection interface. In a step 108, a JTAG controller including at least one JTAG insertion interface and an external-device connection interface is provided. In a step 109, the at least one JTAG insertion interface is insert with and electrically connect to the JTAG connection interface. In a step 110, a detection device including a connection interface is provided, wherein the connection interface is configured to electrically connect to the external-device connection interface. In a step 111, the first detection board is serially connected to the second detection board, wherein the detection device generates a DIMM detection instruction, the JTAG controller converts the generated DIMM detection instruction into a DIMM detection instruction in JTAG format, and provides the DIMM detection instruction in JTAG format to the first detection board and the second detection board through the adapter circuit board, to detect the at least two DDR5 SDRAM DIMM slots of the circuit board under test based on the DIMM detection instruction in JTAG format.

According to above-mentioned contents, the difference between the present invention and the conventional technology is that the first detection board is serially connected to the second detection board, the JTAG controller converts the DIMM detection instruction, which is generated by the detection device, into the DIMM detection instruction in JTAG format; the DIMM detection instruction in JTAG format is provided to the first detection board or second detection board through the adapter circuit board, so as to detect DDR5 SDRAM DIMM slots of the circuit board under test.

Therefore, the above-mentioned technical solution of the present invention is able to solve the conventional problem of long test cycle, low coverage for physical pin connection verification, and deviation in error reporting directionality, so as to achieve the technical effect of improving efficiency in detection for DDR5 SDRAM DIMM connection interface.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A DDR5 (double data rate fifth-generation) SDRAM (synchronous dynamic random-access memory) DIMM (dual in-line memory module) slot detection system, comprising:
- a circuit board under test, comprising at least two dual in-line memory module (DIMM) slots adapted to double data rate fifth-generation synchronous dynamic random-access memory (DDR5 SDRAM);
- a first detection board, comprising a first DIMM connection interface, a first universal serial bus type-C (USB-C) connection interface and a second USB-C connection interface, wherein the first detection board is inserted into one of the at least two DDR5 SDRAM DIMM slots of the circuit board under test through the first DIMM connection interface;
- a second detection board, comprising a second DIMM connection interface, a third USB-C connection interface, and a fourth USB-C connection interface, wherein the second detection board is inserted into another of the at least two DDR5 SDRAM DIMM slots of the circuit board under test through the second DIMM connection interface, wherein the third USB-C connection interface is electrically connected to the second USB-C connection interface;
- an adapter circuit board, comprising a USB-C connection interface and a joint test action group (JTAG) connection interface, wherein the JTAG connection interface support includes but not limited to "IEEE 1149.1" and "IEEE 1149.6" which refer to an approved IEEE standard project, wherein the USB-C connection interface is electrically connected to the first USB-C connection interface, and the adapter circuit board provides data conversion between the USB-C connection interface and the JTAG connection interface;
- a JTAG controller, comprising at least one JTAG insertion interface and an external-device connection interface, wherein the JTAG controller and the at least one JTAG insertion interface support include but not limited to "IEEE 1149.1" and "IEEE 1149.6" which refer to the approved IEEE standard project, wherein the at least one JTAG insertion interface is provided to insert with and electrically connected to the JTAG connection interface; and
- a detection device, comprising a connection interface configured to electrically connect to the external-device connection interface;
- wherein the first detection board is serially connected to the second detection board, the detection device generates a DIMM detection instruction, the JTAG controller converts the generated DIMM detection instruction into a DIMM detection instruction in JTAG format and then provides the DIMM detection instruction in JTAG format to the first detection board and the second detection board through the adapter circuit board, to detect the at least two DDR5 SDRAM DIMM slots of the circuit board under test based on the DIMM detection instruction in JTAG format.

2. The DDR5 SDRAM DIMM slot detection system according to claim 1, wherein each of the first detection board and the second detection board comprise a direct current (DC) converter, a first multiple-selection (Multi_sel) chip, a buffer, a first complex programmable logic device (CPLD) chip, a second CPLD chip, a microcontroller (MCU), a second Multi_sel chip and an analog-to-digital converter (ADC).

3. The DDR5 SDRAM DIMM slot detection system according to claim 2, wherein the first DIMM connection interface and the second DIMM connection interface are electrically connected to the DC converter, the first CPLD chip, the second Multi_sel chip and the ADC, wherein the second USB-C connection interface and the fourth USB-C connection interface are electrically connected to the first Multi_sel chip, the first USB-C connection interface and the third USB-C connection interface are electrically connected to the first Multi_sel chip and the buffer, the buffer is electrically connected to the second USB-C connection interface and the fourth USB-C connection interface and the first CPLD chip, the first CPLD chip is electrically connected to the buffer and the second CPLD chip, the second CPLD chip is electrically connected to the first Multi_sel chip, the second Multi_sel chip, the first CPLD chip and the microcontroller, wherein the microcontroller is electrically connected to the second CPLD chip and the ADC, the second Multi_sel chip is electrically connected to the first DIMM connection interface, the second DIMM connection interface, the second CPLD chip and the ADC, wherein the ADC is electrically connected to the first DIMM connection interface, the second DIMM connection interface, the microcontroller and the second Multi_sel chip.

4. The DDR5 SDRAM DIMM slot detection system according to claim 1, wherein the USB-C connection interface comprises an upper pin set and a lower pin set, the upper pin set comprise an upper test data in (TDI) pin, an upper test data out (TDO) pin, an upper test clock (TCK) pin, an upper test mode select (TMS) pin, and a plurality of upper ground (GND) pins, wherein the lower pin set comprises a lower TDI pin, a lower TDO pin, a lower TCK pin, a lower TMS pin, and a plurality of lower GND pins.

5. The DDR5 SDRAM DIMM slot detection system according to claim 1, wherein the JTAG connection interface comprises ten pins arranged in an upper row and a lower row, and each of the upper row and the lower row comprises five pins, wherein a TCK pin, a TMS pin, a TDI pin, a TDO pin and a plurality of ground pins of the five pins are arranged in fixed positions.

6. A DDR5 (double data rate fifth-generation) SDRAM (synchronous dynamic random-access memory) DIMM (dual in-line memory module) slot detection method, comprising:
- providing a circuit board under test which comprises at least two DIMM slots adapted to DDR5 SDRAM;
- providing a first detection board comprising a first DIMM connection interface, a first USB-C connection interface, and a second USB-C connection interface;
- inserting the first detection board into one of the at least two DDR5 SDRAM DIMM slots of the circuit board under test through the first DIMM connection interface;
- providing a second detection board comprising a second DIMM connection interface, a third USB-C connection interface and a fourth USB-C connection interface;
- inserting the second detection board into another of the at least two DDR5 SDRAM DIMM slots of the circuit board under test through the second DIMM connection interface, wherein the third USB-C connection interface is electrically connected to the second USB-C connection interface;
- providing an adapter circuit board comprising a USB-C connection interface and a JTAG connection interface, wherein the JTAG connection interface support includes but not limited to "IEEE 1149.1" and "IEEE 1149.6" which refer to an approved IEEE standard project;

electrically connecting the USB-C connection interface to the first USB-C connection interface, wherein the adapter circuit board provides data conversion between the USB-C connection interface and the JTAG connection interface;

providing a JTAG controller comprising at least one JTAG insertion interface and an external-device connection interface, wherein the JTAG controller and the at least one JTAG insertion interface support include but not limited to "IEEE 1149.1" and "IEEE 1149.6" which refer to the approved IEEE standard project;

using the at least one JTAG insertion interface to insert with and electrically connect to the JTAG connection interface;

providing a detection device comprising a connection interface, wherein the connection interface is configured to electrically connect to the external-device connection interface; and serially connecting the first detection board to the second detection board, wherein the detection device generates a DIMM detection instruction, the JTAG controller converts the generated DIMM detection instruction into a DIMM detection instruction in JTAG format, and provides the DIMM detection instruction in JTAG format to the first detection board and the second detection board through the adapter circuit board, to detect the at least two DDR5 SDRAM DIMM slots of the circuit board under test based on the DIMM detection instruction in JTAG format.

7. The DDR5 SDRAM DIMM slot detection method according to claim 6, wherein each of the first detection board and the second detection board comprises a DC converter, a first Multi_sel chip, a buffer, a first CPLD chip, a second CPLD chip, a microcontroller, a second Multi_sel chip, and an ADC.

8. The DDR5 SDRAM DIMM slot detection method according to claim 7, wherein the first DIMM connection interface and the second DIMM connection interface are electrically connected to the DC converter, the first CPLD chip, the second Multi_sel chip and the ADC, wherein the second USB-C connection interface and the fourth USB-C connection interface are electrically connected to the first Multi_sel chip, the first USB-C connection interface and the third USB-C connection interface are electrically connected to the first Multi_sel chip and the buffer, the buffer is electrically connected to the second USB-C connection interface and the fourth USB-C connection interface and the first CPLD chip, the first CPLD chip is electrically connected to the buffer and the second CPLD chip, the second CPLD chip is electrically connected to the first Multi_sel chip, the second Multi_sel chip, the first CPLD chip and the microcontroller, the microcontroller is electrically connected to the second CPLD chip and the ADC, the second Multi_sel chip is electrically connected to the first DIMM connection interface and the second DIMM connection interface, the second CPLD chip and the ADC, wherein the ADC is electrically connected to the first DIMM connection interface and the second DIMM connection interface, the microcontroller and the second Multi_sel chip.

9. The DDR5 SDRAM DIMM slot detection method according to claim 6, wherein the USB-C connection interface comprises an upper pin set and a lower pin set, the upper pin set comprises an upper TDI pin, an upper TDO pin, an upper TCK pin, an upper TMS pin, and a plurality of upper GND pins, wherein the lower pin set comprises a lower TDI pin and lower TDO pin, a lower TCK pin, a lower TMS pin, and a plurality of lower GND pins.

10. The DDR5 SDRAM DIMM slot detection method according to claim 6, wherein the JTAG connection interface comprises ten pins arranged in an upper row and a lower row, and each of the upper row and the lower row comprises five pins, wherein a TCK pin, a TMS pin, a TDI pin, a TDO pin and a plurality of ground pin of the five pins are arranged in fixed positions.

* * * * *